(12) United States Patent
Ryoki et al.

(10) Patent No.: US 11,437,773 B2
(45) Date of Patent: Sep. 6, 2022

(54) WAVELENGTH CONVERSION DEVICE

(71) Applicant: Panasonic Intellectual Property Management Co., Ltd., Osaka (JP)

(72) Inventors: Naoya Ryoki, Osaka (JP); Kentaro Miyano, Osaka (JP); Hiroshi Ohno, Osaka (JP); Akihiko Ishibashi, Osaka (JP); Masaki Nobuoka, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 261 days.

(21) Appl. No.: 16/889,279

(22) Filed: Jun. 1, 2020

(65) Prior Publication Data

US 2020/0388981 A1 Dec. 10, 2020

(30) Foreign Application Priority Data

Jun. 7, 2019 (JP) .............................. JP2019-106935

(51) Int. Cl.
| | |
|---|---|
| *H01S 3/109* | (2006.01) |
| *H01S 3/16* | (2006.01) |
| *G02F 1/355* | (2006.01) |
| *C30B 29/22* | (2006.01) |
| *C30B 15/28* | (2006.01) |
| *H01S 3/0941* | (2006.01) |
| *C30B 15/00* | (2006.01) |

(52) U.S. Cl.
CPC .............. *H01S 3/109* (2013.01); *C30B 15/28* (2013.01); *C30B 29/22* (2013.01); *G02F 1/3551* (2013.01); *H01S 3/1611* (2013.01); *H01S 3/1643* (2013.01); *C30B 15/00* (2013.01); *H01S 3/09415* (2013.01)

(58) Field of Classification Search
CPC ......... H01S 3/0092; H01S 3/109–1095; H01S 5/0092; H01S 5/0604–0605; G02F 1/3551–3553
See application file for complete search history.

(56) References Cited

U.S. PATENT DOCUMENTS

| | | | | |
|---|---|---|---|---|
| 5,530,267 A | * | 6/1996 | Brandie, Jr. | ........ H01L 31/1852 |
| | | | | 257/76 |
| 6,551,528 B1 | | 4/2003 | Sasaki et al. | |
| | | (Continued) | | |

FOREIGN PATENT DOCUMENTS

| | | |
|---|---|---|
| JP | 5-011295 | 1/1993 |
| JP | 8-036199 | 2/1996 |
| | (Continued) | |

*Primary Examiner* — Sean P Hagan
(74) *Attorney, Agent, or Firm* — Wenderoth, Lind & Ponack, L.L.P.

(57) ABSTRACT

A wavelength conversion device including a cavity that includes an $RAMO_4$ crystal having a single crystal represented by a first general formula of $RAMO_4$, a laser crystal, and a mirror, in which in the first general formula, R represents one or a plurality of trivalent elements selected from the group consisting of Sc, In, Y, and lanthanoid elements, A represents one or a plurality of trivalent elements selected from the group consisting of Fe (III), Ga, and Al, and M represents one or a plurality of divalent elements selected from the group consisting of Mg, Mn, Fe (II), Co, Cu, Zn, and Cd.

6 Claims, 3 Drawing Sheets

(56) References Cited

U.S. PATENT DOCUMENTS

| | | | |
|---|---|---|---|
| 2004/0061099 A1* | 4/2004 | Ebbers | G02F 1/3551 |
| | | | 252/647 |
| 2005/0030983 A1 | 2/2005 | Momiuchi et al. | |
| 2006/0243197 A1* | 11/2006 | Hanamura | C09K 11/643 |
| | | | 252/301.4 R |
| 2009/0021830 A1* | 1/2009 | Totzeck | G03F 7/70966 |
| | | | 359/489.03 |
| 2013/0187184 A1* | 7/2013 | Camras | H01L 33/504 |
| | | | 257/98 |
| 2017/0338101 A1* | 11/2017 | Ueta | H01L 21/02458 |
| 2020/0387047 A1* | 12/2020 | Miyano | G02F 1/3544 |

FOREIGN PATENT DOCUMENTS

| | | | | |
|---|---|---|---|---|
| JP | 2005-057043 | | 3/2005 | |
| JP | 2006-295215 | | 10/2006 | |
| JP | 2006295215 | A * | 10/2006 | |
| JP | 3936466 | B | 6/2007 | |
| JP | 4100733 | B | 6/2008 | |
| WO | WO-8808829 | A2 * | 11/1988 | C04B 35/443 |

\* cited by examiner

100 Wavelength conversion device

400 High frequency heating furnace

WAVELENGTH CONVERSION DEVICE

BACKGROUND

1. Technical Field

The present disclosure relates to a wavelength conversion device.

2. Description of the Related Art

In the related art, many wavelength conversion devices for obtaining visible laser light such as green light or for obtaining ultraviolet laser light obtained by further converting green light by wavelength-converting light emitted from an Nd:YAG laser or an Nd:YVO$_4$ laser using a nonlinear optical effect have been developed and put into practical use. These converted lights are used for laser processing, laser displays, and the like.

As one of the wavelength conversion methods using the nonlinear optical effect, the use of a nonlinear optical crystal having a birefringence is widely known. Various inorganic oxide-based crystals have been studied as nonlinear optical crystals. For example, GdCOB (chemical formula: GdCa$_4$O(BO$_3$)$_3$) having a basic structure of boron trioxide (BO$_3$) is excellent as a nonlinear optical crystal for generating a second harmonic of an Nd:YAG laser, and YCOB (chemical formula: YCa$_4$O(BO$_3$)$_3$) having a larger birefringence than that of GdCOB is also reported as an excellent nonlinear optical crystal.

For example, Japanese Patent No. 4100733 discloses that YCOB is suitable for generating a third harmonic of an Nd:YAG laser. In addition, Japanese Patent No. 3936466 discloses GdYCOB, which is a mixed crystal of GdCOB and YCOB, and discloses a method of controlling the birefringence by the composition ratio of Gd and Y.

SUMMARY

The present disclosure provides a following wavelength conversion device.

A wavelength conversion device according to a first aspect of the present disclosure is a wavelength conversion device including a cavity that includes an RAMO$_4$ crystal having a single crystal represented by a first general formula of RAMO$_4$, a laser crystal, and a mirror, in which in the first general formula, R represents one or a plurality of trivalent elements selected from the group consisting of Sc, In, Y, and lanthanoid elements, A represents one or a plurality of trivalent elements selected from the group consisting of Fe (III), Ga, and Al, and M represents one or a plurality of divalent elements selected from the group consisting of Mg, Mn, Fe (II), Co, Cu, Zn, and Cd.

A wavelength conversion device according to a second aspect of the present disclosure is the wavelength conversion device according to the first aspect, in which the laser crystal may be any one of Nd:YAG, Nd:YVO$_4$, Yb:YAG or Yb:YVO$_4$.

A wavelength conversion device according to a third aspect of the present disclosure is the wavelength conversion device according to the first or second aspect, in which in the first general formula of RAMO$_4$, R may be Sc or In, A may be Al or Ga, and M may be one or a combination selected from the group consisting of Mg, Co, and Mn.

A wavelength conversion device according to a fourth aspect of the present disclosure is the wavelength conversion device according to the third aspect, in which the RAMO$_4$ crystal may be a crystal represented by a chemical formula of InGaMgO$_4$.

A wavelength conversion device according to a fifth aspect of the present disclosure is the wavelength conversion device according to the first or second aspect, in which the RAMO$_4$ crystal may be a crystal represented by a second general formula of ScAlM'O$_4$, and in the second general formula, M' may represent one or a combination selected from the group consisting of Mg, Co and Mn.

A wavelength conversion device according to a sixth aspect of the present disclosure is the wavelength conversion device according to the fifth aspect, in which the RAMO$_4$ crystal may be a crystal represented by a chemical formula of ScAlMg$_x$Co$_{1-x}$O$_4$, and x in the chemical formula is $0.7 \leq x \leq 0.9$.

DETAILED DESCRIPTION

The birefringence at 1,064 nm, which is an oscillation wavelength of an Nd:YAG laser, is 0.034 for GdCOB and 0.041 for YCOB. In these mixed crystals, GdYCOB, a range of the birefringence that can be controlled by the composition ratio of Gd and Y is between 0.034 to 0.041. Therefore, GdYCOB is not suitable for generating higher-order harmonics than a third harmonic of the Nd:YAG laser. Here, examples of the crystal suitable for a fourth harmonic generation of the Nd:YAG laser include CLBO (chemical formula: CsLiB$_6$O$_{10}$) having a birefringence of 0.050. However, CLBO crystals are brittle and deliquescent. Therefore, there is a problem that a package in a dry atmosphere or use in a heated state is indispensable to achieve a longer life of a wavelength conversion device. In order to generate these optical harmonics more stably and with high efficiency, there is a demand for a crystal having an appropriately large birefringence, capable of controlling the birefringence by the composition ratio, and being mechanically, chemically and thermally stable.

An object of the present disclosure is to solve the above-described problems in the related art, and to provide a wavelength conversion device that stably and efficiently generates optical harmonics.

Hereinafter, a wavelength conversion device according to an exemplary embodiment of the present disclosure will be described with reference to the drawings.

In the present exemplary embodiment, a wavelength conversion device using an RAMO$_4$ crystal including a single crystal represented by a first general formula of RAMO$_4$ will be described. In the general formula, R represents one or a plurality of trivalent elements selected from the group consisting of Sc, In, Y, and lanthanoid elements, A represents one or a plurality of trivalent elements selected from the group consisting of Fe (III), Ga, and Al, and M represents one or a plurality of divalent elements selected from the group consisting of Mg, Mn, Fe (II), Co, Cu, Zn, and Cd.

Figure 1:
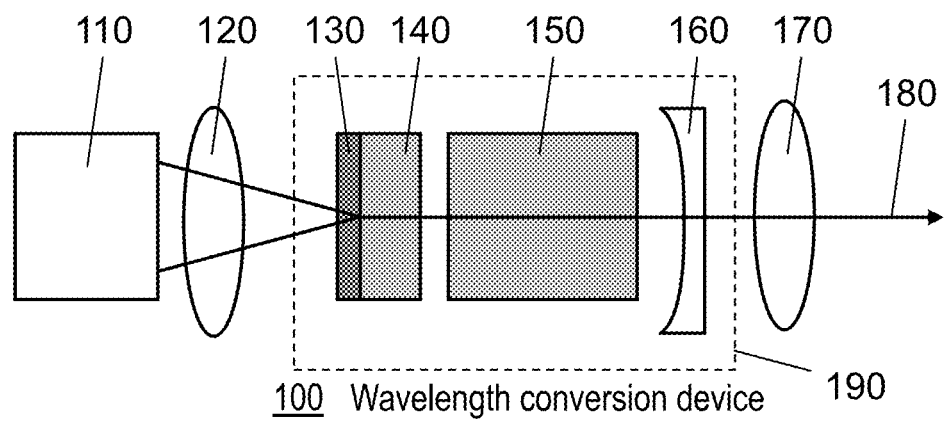
FIG. 1 is a schematic diagram illustrating a configuration of a wavelength conversion device according to a present exemplary embodiment.

FIG. 1 is a schematic diagram illustrating a configuration of the wavelength conversion device according to the present exemplary embodiment. Wavelength conversion device 100 illustrated in FIG. 1 includes excitation laser diode 110, condenser lens 120, mirror coating 130, laser crystal 140, $RAMO_4$ crystal 150, output mirror 160, and collimating lens 170.

Excitation light emitted from excitation laser diode 110 is condensed by condenser lens 120 and is incident on laser crystal 140 with mirror coating 130 that transmits the excitation light applied to an end surface. In this configuration, the excitation light is incident from the end surface of laser crystal 140 (surface on which mirror coating 130 is applied), and may be incident from a side surface of laser crystal 140. In that case, mirror coating 130 may be a total reflection mirror. In addition, instead of mirror coating 130, a mirror having similar reflection characteristics may be disposed adjacent to laser crystal 140.

In the present exemplary embodiment, laser crystal 140 is Nd:YAG, and Nd:YVO$_4$, Yb:YAG, Yb:YVO$_4$, or the like can also be used. According to these, it is possible to correspond to an oscillation wavelength of a practical solid-state laser. Laser crystal 140 excited by the incident excitation light emits light of a predetermined wavelength (fundamental wave). The light transmits $RAMO_4$ crystal 150 and is reflected by output mirror 160 disposed ahead thereof.

In wavelength conversion device 100 of the present embodiment, cavity (optical resonator) 190 is formed by laser crystal 140 with mirror coating 130 applied to the end surface, $RAMO_4$ crystal 150, and output mirror 160, and the light reciprocates repeatedly in cavity 190 and is amplified by stimulated emission each time the light transmits laser crystal 140.

In addition, when the light transmits $RAMO_4$ crystal 150, a polarized wave having a wavelength different from the fundamental wave is generated due to the nonlinear optical effect, and the amplitude of the polarized wave having a wavelength satisfying the phase matching condition is amplified.

Output mirror 160 is configured to totally reflect the fundamental wave and the excitation light, and to transmit a polarized wave having a desired wavelength. A traveling direction of the light transmitted output mirror 160 is adjusted by collimating lens 170 in parallel. As described above, laser light 180 whose wavelength is converted to a desired wavelength is obtained.

When laser crystal 140 is Nd:YAG as in the present embodiment, laser crystal 140 is excited by excitation laser diode 110 having a wavelength of 808 nm to generate infrared light having a wavelength of 1,064 nm. When the $RAMO_4$ crystal satisfies half the phase matching condition of the wavelength of 532 nm, the wavelength is converted to light of the wavelength of 532 nm. That is, a second harmonic is generated, and green laser light 180 is obtained.

In addition, when the $RAMO_4$ crystal satisfies the phase matching condition of ⅓ wavelength of 355 nm, wavelength conversion to a wavelength of 355 nm is performed. That is, a third harmonic is generated, and an ultraviolet (UV-A) laser light 180 is obtained.

Furthermore, when the $RAMO_4$ crystal satisfies the phase matching condition of ¼ wavelength of 266 nm, the wavelength conversion to a wavelength of 266 nm is performed. That is, a fourth harmonic is generated, and deep ultraviolet (UV-C) laser light 180 is obtained.

Whether the above various phase matching conditions are satisfied largely depends on the birefringence Δn of the $RAMO_4$ crystal. The birefringence Δn is a difference between the refractive index $n_o$ of ordinary light (Ordinary Ray) and the refractive index $n_e$ of extraordinary light (Extraordinary Ray). When the birefringence Δn is small, wavelength conversion is impossible, and when the birefringence Δn too large, the conversion efficiency degrades because the phase matching condition is deviated.

Figure 2:
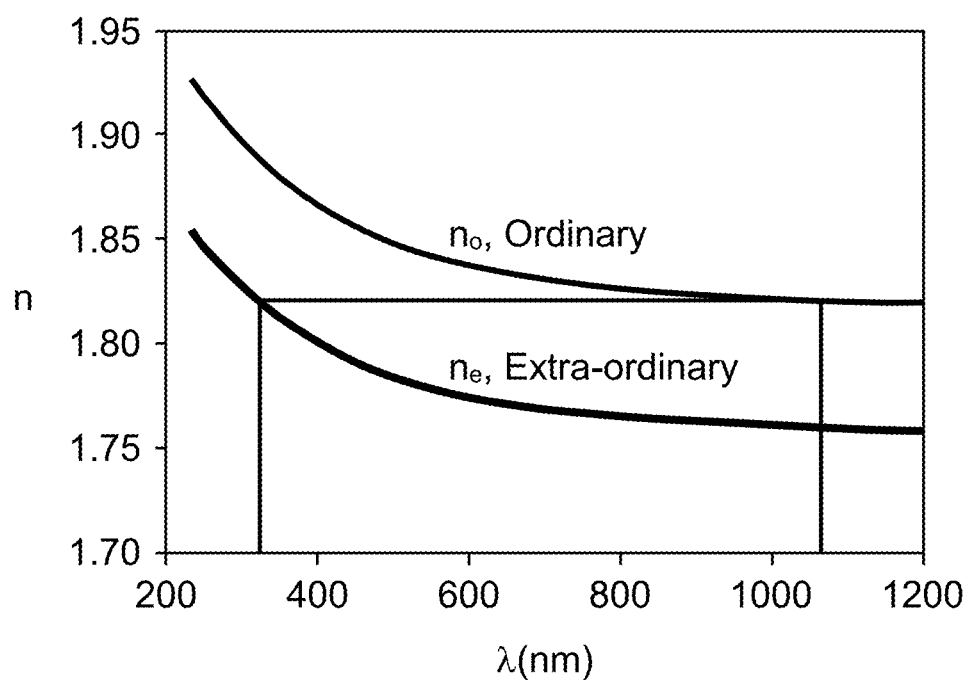
FIG. 2 is a diagram illustrating a refractive index dispersion of an ScAlMgO$_4$ crystal used in the wavelength conversion device of the present exemplary embodiment.

Hereinafter, a description will be given using an example of an ScAlMgO$_4$ crystal which is one of the $RAMO_4$ crystals. FIG. 2 is a diagram illustrating a refractive index dispersion of an ScAlMgO$_4$ crystal in the present exemplary embodiment. The refractive index was measured by spectroscopic ellipsometry evaluation using M-2000 manufactured by J. A. Woollam Co., Ltd. Reflection Muller measurement and transmission Muller measurement were performed at a plurality of angles under conditions of a wavelength of 245 nm to 1700 nm and normal temperature, and a refractive index was derived by fitting. The refractive index in a portion of the wavelength region where there is no measured value was extrapolated by polynomial approximation.

As illustrated in FIG. 2, the refractive index $n_o$ of ordinary light of the ScAlMgO$_4$ crystal is 1.822, the refractive index $n_e$ of extraordinary light is 1.761, and the birefringence Δn is 0.061 at 1064 nm, which is the oscillation wavelength of the Nd:YAG laser. This is a large value as compared with the birefringence Δn=0.034 of GdCOB (chemical formula: GdCa$_4$O (BO$_3$)$_3$) which is a typical nonlinear optical crystal in the related art, the birefringence Δn=0.041 of YCOB (chemical formula: YCa$_4$O (BO$_3$)$_3$), and the birefringence Δn=0.050 of CLBO (chemical formula: CsLiB$_6$O$_{10}$).

In addition, the refractive index $n_o$ of ordinary light=1.822 at 1064 nm of the ScAlMgO$_4$ crystal coincides with the refractive index $n_e$ of extraordinary light=1.822 at 320 nm. Therefore, by adjusting the angle and temperature of the ScAlMgO$_4$ single crystal, it is possible to perform the wavelength conversion while satisfying the phase matching condition in the wavelength region around 320 nm. In addition, as the birefringence Δn at 1064 nm is larger, the refractive index $n_e$ of extraordinary light on the shorter wavelength side coincides with the refractive index $n_o$ of ordinary light at 1064 nm, so that it is possible to perform wavelength conversion to a shorter wavelength.

The CLBO crystal is known as a crystal capable of generating the fourth harmonic (266 nm) of an Nd:YAG laser, and it can be said that the $RAMO_4$ crystal having a birefringence Δn larger than that of the CLBO crystal is suitable for wavelength conversion to a shorter wavelength, that is, generation of higher-order harmonics.

In order to be applied as a nonlinear optical crystal, it is required that the crystal can be industrially grown and that the crystal is mechanically, chemically, and thermally stable, in addition to the optical characteristics. On the other hand, since the $RAMO_4$ crystal (for example, ScAlMgO$_4$ crystal) can grow a bulk crystal by a crystal pulling apparatus using the Czochralski method, crystal can be industrially grown. The detailed manufacturing method will be described later.

In addition, the mechanical, chemical and thermal characteristics of $RAMO_4$ crystal (for example, ScAlMgO$_4$ crystal) are excellent as follows. For example, the Mohs hardness of the ScAlMgO$_4$ crystal is 4 to 5 [mohs'], and has sufficient strength as a nonlinear optical crystal. ScAlMgO$_4$ crystals are not water-soluble and deliquescent, and there is no restriction on the humidity of the use environment. The melting point of the $ScAlMgO_4$ crystal is approximately 1900 [° C.], and is significantly thermally stable. That is, the $RAMO_4$ crystal (for example, $ScAlMgO_4$ crystal) is a crystal that is mechanically, chemically, and thermally stable, and is suitable for a nonlinear optical crystal.

Figure 3:
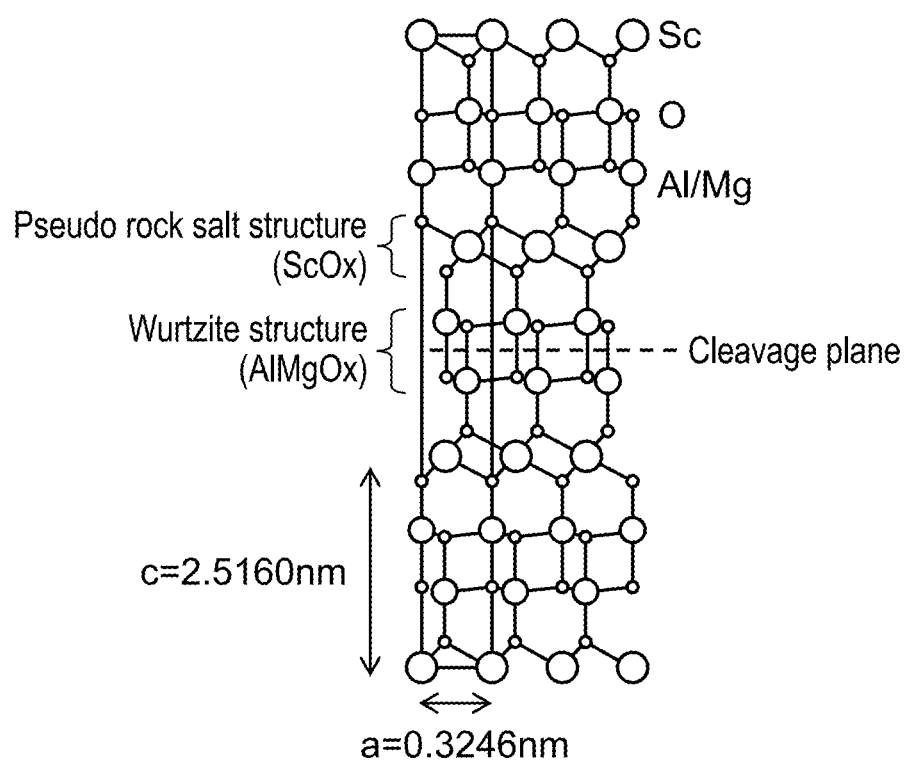
FIG. 3 is a diagram illustrating a lattice model of the ScAlMgO$_4$ crystal used for the wavelength conversion device of the present exemplary embodiment.

FIG. 3 is a diagram illustrating a lattice model of an $ScAlMgO_4$ crystal which is an example of the $RAMO_4$ crystal in the present exemplary embodiment. The $ScAlMgO_4$ crystal has a structure in which an $ScO_x$ layer having a pseudo rock salt structure and an $AlMgO_4$ layer having a wurtzite structure are alternately stacked, and has a property that the crystal is cleaved on a (0001) plane (cleavage plane) similar to graphite and hexagonal BN. This cleavage property suitably acts when the crystal is processed into a predetermined shape based on the (0001) plane.

The lattice constant of the a-axis of the $ScAlMgO_4$ crystal is 0.3246 nm, and the lattice constant of the c-axis is 2.5160 nm. The large difference between the lattice constants of the a-axis and the c-axis contributes to good nonlinear optical characteristics (anisotropic).

Here, the lattice constant of the $RAMO_4$ crystal changes when the constituent element is replaced with another element or the composition ratio is changed. Since there is a correlation between the birefringence Δn and the lattice constant, the birefringence Δn can be freely controlled by changing the constituent elements and the composition ratio of the $RAMO_4$ crystal.

For example, when R of the general formula of $RAMO_4$ is Sc or In, A is Al or Ga, and M is one or a combination selected from the group consisting of Mg, Co, and Mn, various lattice constants and various birefringence Δn can be realized. Table 1 illustrates the chemical formulas of these crystals, the lattice constant of the a-axis, and the calculated value of the birefringence Δn at 1064 nm.

TABLE 1

| Chemical formula | Lattice constant of a-axis [nm] | Birefringence Δn @ 1064 nm |
| --- | --- | --- |
| $ScAlMgO_4$ | 0.3236 | 0.061 |
| $ScAlCoO_4$ | 0.3248 | 0.054 |
| $ScAlMnO_4$ | 0.3259 | 0.049 |
| $ScGaMgO_4$ | 0.3271 | 0.044 |
| $InAlMgO_4$ | 0.3290 | 0.039 |
| $InGaMgO_4$ | 0.3302 | 0.036 |

When the constituent elements of the $RAMO_4$ crystal are changed as illustrated in Table 1, the birefringence Δn of the crystal is distributed from 0.036 to 0.061. Therefore, by preparing a mixed crystal of these crystals and adjusting the composition ratio, it is possible to control the birefringence Δn to an arbitrarily value between 0.036 and 0.061.

In the related art, a GdCOB crystal having a birefringence Δn=0.034 is known as a crystal capable of generating a second harmonic (532 nm) of an Nd:YAG laser. A YCOB crystal having a birefringence Δn=0.041 is known as a crystal capable of generating a third harmonic (355 nm) of an Nd:YAG laser. A CLBO crystal having a birefringence Δn=0.050 is known as a crystal capable of generating a fourth harmonic (266 nm) of an Nd:YAG laser. In view of these, it can be said that the above $RAMO_4$ crystal can obtain a birefringence suitable for an arbitrarily wavelength from the second harmonic to the fourth harmonic of the Nd:YAG laser.

Among the above combinations, $InGaMgO_4$ having a birefringence Δn=0.036 satisfies the non-critical phase matching condition in which the phase matching angle is 90° at room temperature in the generation of the second harmonic (532 nm) of the Nd:YAG laser. Therefore, it is most suitable for generating the second harmonic (532 nm) of the Nd:YAG laser.

On the other hand, when the $RAMO_4$ crystal is $ScAlMgO_4$, $ScAlCoO_4$, $ScAlMnO_4$, or a mixed crystal thereof, that is, a crystal represented by the second general formula of $ScAlM'O_4$ (M' represents one or a combination selected from the group consisting of Mg, Co, and Mn), the birefringence Δn can be controlled between 0.049 and 0.061, that is, a moderately large value. In the related art, the CLBO crystal having a birefringence Δn=0.050 is known as a crystal capable of generating the fourth harmonic (266 nm) of an Nd:YAG laser. Therefore, it can be said that the crystal represented by the general formula of $ScAlM'O_4$ is suitable for generating the fourth harmonic (266 nm) of the Nd:YAG laser.

Furthermore, as the $RAMO_4$ crystal, a mixed crystal of $ScAlMgO_4$ and $ScAlCoO_4$ having high stability in crystal growth is also preferable. The $RAMO_4$ crystal is a crystal (0<x<1) represented by the chemical formula of $ScAlMg_xCo_{1-x}O_4$. Table 2 illustrates the lattice constant of the a-axis and the calculated value of the birefringence Δn at 1064 nm when the composition ratio x in the chemical formula was changed.

TABLE 2

| Composition ratio x in $ScAlMg_xCo_{1-x}O_4$ | Lattice constant of a-axis [nm] | Birefringence Δn @ 1064 nm |
| --- | --- | --- |
| 1.0 | 0.3236 | 0.061 |
| 0.9 | 0.3237 | 0.060 |
| 0.8 | 0.3238 | 0.060 |
| 0.7 | 0.3240 | 0.059 |
| 0.6 | 0.3241 | 0.058 |
| 0.5 | 0.3242 | 0.058 |
| 0.4 | 0.3243 | 0.057 |
| 0.3 | 0.3244 | 0.056 |
| 0.2 | 0.3246 | 0.056 |
| 0.1 | 0.3247 | 0.055 |

From Table 2, when x representing the composition ratio of Mg and Co is 0.7 to 0.9, the birefringence Δn is between 0.059 and 0.060, and the non-critical phase matching condition in which the phase matching angle is 90° is satisfied at room temperature, in the generation of the third harmonic (355 nm) of the Nd:YAG laser. Therefore, this configuration is optimal for generating the third harmonic (355 nm) of the Nd:YAG laser.

$RAMO_4$ crystal 150 applicable to the present disclosure is not limited to the combination of the elements exemplified above and the composition ratio thereof, including the $ScAlMgO_4$ crystal. In addition, the oscillation wavelength of laser crystal 140 is not limited to 1064 nm of Nd:YAG.

In addition, various materials having a high reflectance for light of a predetermined wavelength can be used for mirror coating 130 and output mirror 160. In addition, various materials that transmit light of a predetermined wavelength can be used for condenser lens 120 and collimating lens 170. In addition, when generating optical harmonics by phase matching, sum frequency generation and difference frequency generation are also possible.

About Growing $RAMO_4$ Crystal

Above $RAMO_4$ crystal 150 can be produced by a crystal pulling apparatus using the Czochralski method (hereinafter also referred to as "CZ method").

Examples of an apparatus (crystal pulling apparatus) for manufacturing $RAMO_4$ crystal 150 of the present exemplary embodiment include a high frequency heating furnace or a resistance heating furnace. Hereinafter, a case where an $ScAlMgO_4$ crystal, which is one of the $RAMO_4$ crystals, is manufactured by a high frequency heating furnace will be described. However, as described above, the $RAMO_4$ crystal is not limited to the $ScAlMgO_4$ crystal. In addition, instead of the high frequency heating furnace, a resistance heating furnace may be used.

Figure 4:
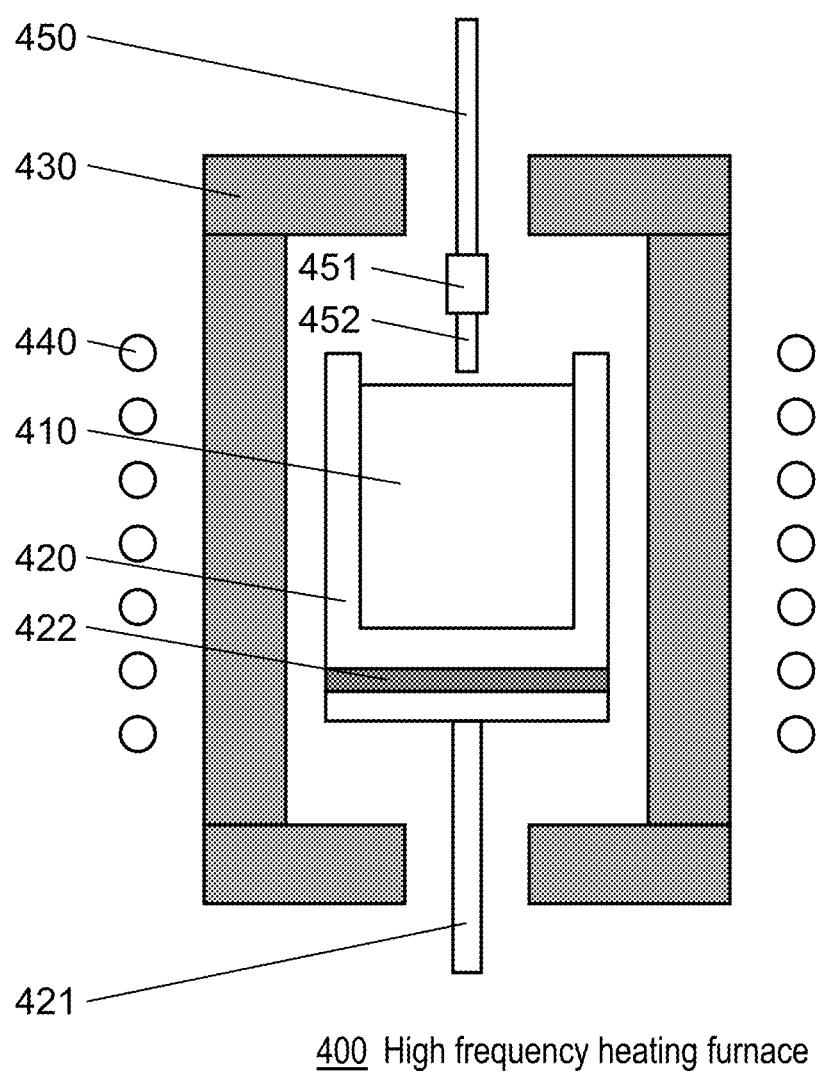
FIG. 4 is a schematic diagram illustrating a configuration of a high frequency heating furnace used for manufacturing the ScAlMgO$_4$ crystal used for the wavelength conversion device of the present exemplary embodiment.

FIG. 4 is a schematic diagram illustrating a configuration of the high frequency heating furnace used for manufacturing the $ScAlMgO_4$ crystal in the present exemplary embodiment. In FIG. 4, high frequency heating furnace 400 includes raw material 410, crucible 420, crucible support shaft 421, refractory material 422, heat insulating material 430, heating coil 440, crystal pulling shaft 450, seed holder 451, and seed crystal 452. Although not illustrated in FIG. 4, high frequency heating furnace 400 may include a chamber, a vacuum pump, a gas inlet, a gas outlet, a high frequency power supply, a temperature and gas flow control device, and the like, necessary for crystal pulling by the CZ method.

Raw material 410 is a mixture of scandium oxide ($Sc_2O_3$), aluminum oxide ($Al_2O_3$), and magnesium oxide (MgO). After the mixture is sintered to increase the packing density, the mixture is filled in crucible 420 and melted by heating.

Crucible 420 is made of iridium and is filled with raw material 410. The material of crucible 420 is not limited thereto, and various materials can be used as long as these have heat resistance at the melting temperature of raw material 410 and a reaction resistance with raw material 410. For example, platinum, tungsten, molybdenum, tantalum and the like are also preferable materials.

Crucible support shaft 421 is made of tungsten and has a function of rotating and moving up and down at a set speed. The material of crucible support shaft 421 is not limited thereto, and various materials having heat resistance at the heating temperature of the relevant portion and strength for supporting raw material 410 and crucible 420 can be used. When crucible 420 does not need to rotate and move up and down, a configuration in which crucible support shaft 421 is omitted is also possible.

Refractory material 422 is made of zirconia, and has a reaction resistance with both materials of crucible 420 and crucible support shaft 421.

Heat insulating material 430 is made of zirconia and surrounds the vicinity of crucible 420. Through-holes for inserting crystal pulling shaft 450 and crucible support shaft 421 are provided above and below crucible 420 of heat insulating material 430, respectively.

The materials of refractory material 422 and heat insulating material 430 are not limited thereto, and various materials having heat resistance at the heating temperature of the relevant portion and a reaction resistance with the ambient atmosphere can be used.

Heating coil 440 is a tube made of copper (copper tube), and is disposed so as to surround heat insulating material 430, and cooling water is circulated inside the copper tube. When a high frequency current flows through heating coil 440, a high frequency magnetic flux is generated. An eddy current is generated in crucible 420 by the high frequency magnetic flux, and the surface of crucible 420 generates heat. As a result, raw material 410 in crucible 420 is heated.

Although not illustrated, high frequency heating furnace 400 also has a mechanism for moving heating coil 440 up and down.

Crystal pulling shaft 450 is made of alumina and has a function of rotating and moving up and down at a set speed. The material of crystal pulling shaft 450 is not limited thereto, and various materials having heat resistance at the heating temperature of the relevant portion and a reaction resistance with the ambient atmosphere can be used. Seed holder 451 is made of iridium, is connected to crystal pulling shaft 450, and can set seed crystal 452 at the tip end. The material of seed holder 451 is not limited thereto, and various materials having heat resistance at the melting temperature of the raw material and a reaction resistance with seed crystal 452 can be used.

Seed crystal 452 is made of $ScAlMgO_4$ and has a regular square prism shape. The shape is not limited thereto as long as processing is possible, and various shapes such as a circular cylinder and a prism having a notch can be used.

When heating and melting raw material 410 and growing the crystal, the atmosphere inside high frequency heating furnace 400 is replaced with an inert gas atmosphere. Specifically, after evacuating the inside of high frequency heating furnace 400, a predetermined gas is introduced and the pressure is adjusted to normal pressure. The gas is supplied from a gas supply source (not illustrated) outside high frequency heating furnace 400 to the inside of high frequency heating furnace 400.

As a gas type, although nitrogen is mainly used as an inert gas, the gas is not limited thereto, and argon or the like may be used.

After replacing the gas atmosphere, raw material 410 is heated and melted to grow crystals. First, after the power supply is turned on, heating is performed by gradually increasing the electric power applied to heating coil 440 over a period of time so as not to apply a large load to crucible 420 until the temperature at which raw material 410 melts. The heating time depends on the size of crucible 420, and when the outer diameter of crucible 420 is 80 mm to 150 mm, it is preferably 15 hours to 60 hours. After the melting of raw material 410 is confirmed, oxygen is introduced into the furnace in order to prevent oxygen deficiency in the crystal to be grown. The oxygen concentration in the furnace is preferably 0.1% by volume to 10% by volume.

Subsequently, a seeding step is performed. Crystal pulling shaft 450 is gradually lowered while rotating at a constant speed until seed crystal 452 comes into contact with molten raw material 410. After seed crystal 452 comes into contact with molten raw material 410, the process waits until the melt temperature of molten raw material 410 is stabilized at a temperature suitable for pulling the crystal.

Subsequently, a crystal growing step is performed. Crystal pulling shaft 450 is raised at a constant speed while rotating at a constant speed. Here, the rotation speed of crystal pulling shaft 450 is preferably 1 rpm to 10 rpm, and the pulling speed is preferably 0.1 mm/h to 1.5 mm/h. A load cell (not illustrated) is provided at the upper end of crystal pulling shaft 450, and the weight of the crystal being pulled up can be measured. After the start of the pulling up, the electric power applied to heating coil 440 is adjusted based on the crystal diameter calculated from the measured weight value. The desired crystal shape is controlled by automatic diameter control (ADC).

After pulling up the crystal to a desired length, the crystal is cut off from raw material 410, and the introduction of oxygen into the furnace is stopped. Subsequently, a cooling step is performed. Heating coil 440 is cooled by gradually reducing the electric power applied to heating coil 440 over a period of time so that a large load is not applied to crucible 420 and the pulled crystal. Although the cooling time depends on the size of crucible 420, when the outer diameter of crucible 420 is 80 mm to 150 mm, it is preferably 20 hours to 70 hours. After the cooling is completed, the crystal is taken out of high frequency heating furnace 400 and processed into a predetermined shape.

According to the present disclosure, it is possible to provide a wavelength conversion device that stably and efficiently generates optical harmonics.

According to the present disclosure, it is possible to provide a wavelength conversion device that stably and efficiently generates optical harmonics. The converted light obtained by the wavelength conversion device is useful for laser processing, laser display, and the like.

What is claimed is:

1. A wavelength conversion device comprising:
   a cavity that includes
   an $RAMO_4$ crystal having a single crystal represented by a first general formula of $RAMO_4$,
   a laser crystal, and
   a mirror,
   wherein in the first general formula,
   R represents one or a plurality of trivalent elements selected from the group consisting of Sc, In, Y, and lanthanoid elements, A represents one or a plurality of trivalent elements selected from the group consisting of Fe (III), Ga, and Al, and M represents one or a plurality of divalent elements selected from the group consisting of Mg, Mn, Fe (II), Co, Cu, Zn, and Cd.

2. The wavelength conversion device of claim 1, wherein the laser crystal is any one of Nd:YAG, Nd:$YVO_4$, Yb:YAG or Yb:$YVO_4$.

3. The wavelength conversion device of claim 1, wherein in the first general formula of $RAMO_4$, R is Sc or In, A is Al or Ga, and M is one or a combination selected from the group consisting of Mg, Co, and Mn.

4. The wavelength conversion device of claim 3, wherein the $RAMO_4$ crystal is a crystal represented by a chemical formula of $InGaMgO_4$.

5. The wavelength conversion device of claim 1, wherein the $RAMO_4$ crystal is a crystal represented by a second general formula of $ScAlM'O_4$, and in the second general formula, M' represents one or a combination selected from the group consisting of Mg, Co and Mn.

6. The wavelength conversion device of claim 5, wherein the $RAMO_4$ crystal is a crystal represented by a chemical formula of $ScAlMg_xCo_{1-x}O_4$, and x in the chemical formula is 0.7 or more and 0.9 or less.

* * * * *